US012626881B2

(12) United States Patent
Lampersberger et al.

(10) Patent No.: US 12,626,881 B2
(45) Date of Patent: May 12, 2026

(54) ABERRATION CORRECTOR, A CHARGED PARTICLE BEAM APPARATUS, A METHOD OF ALIGNING AN ABERRATION CORRECTOR AND A METHOD OF CORRECTING ABERRATION OF A CHARGED PARTICLE BEAM

(71) Applicant: ICT Integrated Circuit Testing Gesellschaft für Halbleiterprüftechnik mbH, Heimstetten (DE)

(72) Inventors: Florian Lampersberger, Munich (DE); John Breuer, Munich (DE); Matthias Firnkes, Walpertskirchen (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 450 days.

(21) Appl. No.: 18/137,226

(22) Filed: Apr. 20, 2023

(65) Prior Publication Data

US 2024/0355576 A1       Oct. 24, 2024

(51) Int. Cl.
*H01J 37/153* (2006.01)

(52) U.S. Cl.
CPC ..... *H01J 37/153* (2013.01); *H01J 2237/1516* (2013.01); *H01J 2237/1534* (2013.01)

(58) Field of Classification Search
CPC ............. H01J 37/153; H01J 2237/1516; H01J 2237/1534
See application file for complete search history.

(56) References Cited

U.S. PATENT DOCUMENTS

| | | | |
|---|---|---|---|
| 11,501,947 B1 * | 11/2022 | Firnkes ................... | H01J 37/15 |
| 2007/0023673 A1 * | 2/2007 | Salvesen ............... | H01J 37/145 |
| | | | 250/396 ML |
| 2022/0172920 A1 * | 6/2022 | Kruit ....................... | H01J 37/12 |
| 2022/0270844 A1 * | 8/2022 | Mita ................... | H01J 37/1413 |

* cited by examiner

*Primary Examiner* — Georgia Y Epps
*Assistant Examiner* — Hanway Chang
(74) *Attorney, Agent, or Firm* — Kilpatrick Townsend & Stockton LLP

(57) ABSTRACT

An aberration corrector. The aberration corrector including a first plurality of magnetic elements, each magnetic element comprising a magnetic pole and a corresponding magnetic rod for providing a magnetic field to the magnetic pole. The first plurality of magnetic elements including at least a first magnetic element, the first magnetic element including a first magnetic pole; a first magnetic rod having a proximal end adjacent to the first magnetic pole and a distal end opposite the proximal end; the proximal end having a tip with a tip surface in a shape of a semi-spheroid; and a contact point of the tip surface contacts the first magnetic pole.

20 Claims, 7 Drawing Sheets

600

700

ABERRATION CORRECTOR, A CHARGED PARTICLE BEAM APPARATUS, A METHOD OF ALIGNING AN ABERRATION CORRECTOR AND A METHOD OF CORRECTING ABERRATION OF A CHARGED PARTICLE BEAM

TECHNICAL FIELD

Embodiments described herein relate to an aberration corrector, a charged particle system including an aberration corrector and methods for aligning a charged particle beam.

BACKGROUND

In charged particle beam devices such as microscopes, micro-machining apparatuses, semiconductor manufacturing apparatuses and so forth, single-stage or multi-stage multipoles (quadrupoles, hexapoles, octupoles and so forth) are used in deflectors or aberration correctors. Machining accuracies for the aforementioned apparatuses can be in the range of 10 micrometer or so. The apparatuses can perform observation with an accuracy in the nanometer range or even the sub-nanometer range.

For such applications, the resolution of the apparatus is beneficially in the sub-nanometer range. Aberration correction with a multipole corrector can improve the performance of charged particle beam apparatuses. Such an aberration corrector includes one or more multipole stages. The quality of the correction depends on the precision of the on-axial multipole fields. Tolerances between pole to pole lead to a disturbed magnetic field distribution on the optical axis.

In particular, in aberration correctors such as spherical aberration correctors and chromatic aberration correctors, where multipole fields involved can be strong, inaccuracies in such correctors can lead to imperfections in the electric and magnetic field profiles, which in turn generate residual aberrations that limit the attainable performance of the apparatus.

Accordingly, high accuracy in manufacturing and assembling is beneficial. For example, accuracy in positioning of poles and other components that make up the magnetic circuit in an aberration corrector is advantageous. This is because such positioning inaccuracies cause parasitic multipole fields which in turn cause blurring of the beam. In addition, solutions to increase accuracy often involve increasing complexity which negatively impacts reproducibility and cost, especially in mass production.

Accordingly, it would be beneficial to provide an aberration corrector, and a method of reducing or minimizing magnetic field deviations between pole to pole.

SUMMARY

In light of the above, an invention as defined by the claims is provided. According to aspects described herein, aberration correctors, a charged particle beam apparatus, a method of aligning an aberration corrector and a method of correcting aberration of a charged particle beam are provided.

According to an embodiment, an aberration corrector is provided. The aberration corrector includes a first plurality of magnetic elements, each magnetic element including a magnetic pole and a corresponding magnetic rod for providing a magnetic field to the magnetic pole. The first plurality of magnetic elements including at least a first magnetic element, the first magnetic element including a first magnetic pole; a first magnetic rod having a proximal end adjacent to the first magnetic pole and a distal end opposite the proximal end; the proximal end having a tip with a tip surface in a shape of a semi-spheroid; and a contact point of the tip surface contacts the first magnetic pole.

According to an embodiment, a charged particle beam apparatus is provided. The charged particle beam apparatus including a sample stage; a charged particle source adapted to generate a charged particle beam; and a charged particle beam manipulation system including the aberration corrector according to any of the embodiments described herein.

According to an embodiment, a method of aligning an aberration corrector is provided. The method including providing a plurality of magnetic poles, the magnetic poles having a predetermined alignment; and contacting the plurality of magnetic poles with a plurality of magnetic rods, wherein each of the plurality of magnetic rods is connected to a corresponding magnetic pole such that the predetermined alignment of the plurality of magnetic poles is substantially maintained.

According to an embodiment, a method of correcting aberration of a charged particle beam with an aberration corrector according to any of the embodiments described herein is provided. The method includes guiding the charged particle beam through an opening of an aberration corrector; and correcting aberrations of the charged particle beam.

Further advantages, features, aspects and details that can be combined with embodiments described herein are evident from the dependent claims, the description and the drawings.

BRIEF DESCRIPTION OF THE DRAWINGS

So that the manner in which the above recited features of the present invention can be understood in detail, a more particular description of embodiments, briefly summarized above, may be had by reference to embodiments. The accompanying drawings relate to one or more embodiments and are described in the following.

DETAILED DESCRIPTION

Figure 1:
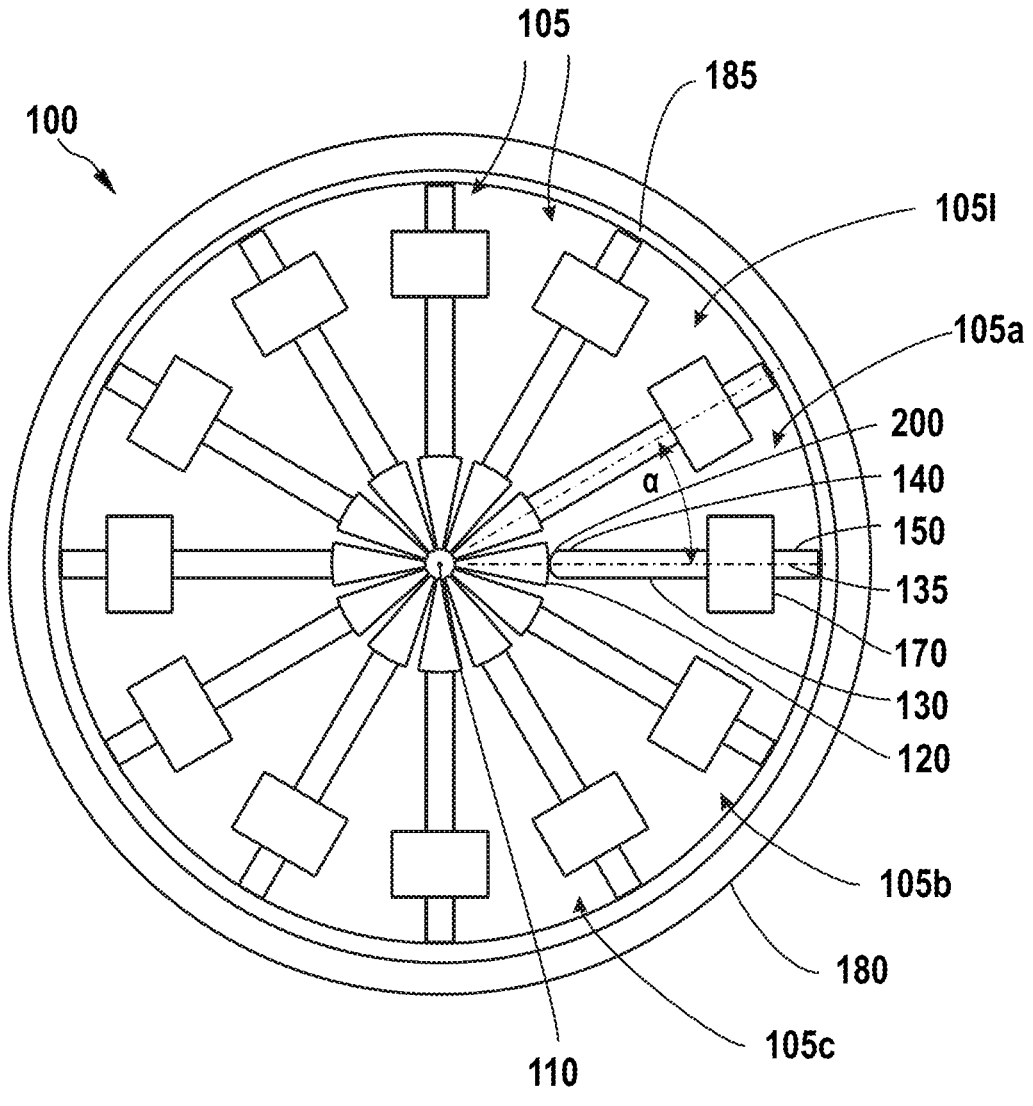
FIG. 1 is a section view of an aberration corrector according to embodiments described herein.

Reference will now be made in detail to the various embodiments, one or more examples of which are illustrated in the figures. Within the following description of the drawings, the same reference numbers refer to the same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

To improve resolution of, for example, an SEM column beyond the limits of simple round lens systems, a multipole corrector can be used to correct for aberrations like spherical, chromatic, coma and other aberrations. Such a multipole-corrector typically includes one or more stages of magnetic and/or electrostatic multipoles (MP), each MP including several poles. The poles can include an electrode and include magnetic elements, for example, 8 or 12 magnetic elements. Each magnetic element includes a magnetic pole which is close to an optical axis, e.g. of the SEM column, and a magnetic rod. The magnetic rod can carry an excitation coil. The magnetic elements of the same multipole may be oriented in a same plane. The magnetic elements may be oriented in a star-like shape oriented around a center axis. The magnetic elements may have equal radial distance to the center axis and may have equal angles between each two neighboring magnetic elements. The magnetic elements may be aligned to form an opening of the aberration corrector, particularly the opening being concentric with the center axis. The opening may be aligned with the optical axis.

The quality of correction depends on the precision of the on-axial MP quadrupole fields. Advantageously, each magnetic pole provides a predetermined amount of magnetic field, particularly the same amount of magnetic field, towards the optical axis. The field may depend on material properties, mechanical tolerances in air gaps of the magnetic circuit and mechanical tolerances of the pole-head shape. The field may depend on the alignment of the magnetic pole and the magnetic rod in each magnetic element. The tolerances may lead to a disturbed magnetic field distribution on the optical axis, which may cause undesired dipole fields and concomitant beam deflection.

According to embodiments of the present disclosure, a joint design between the magnetic pole and the magnetic rod is provided, that can compensate the machining and assembly tolerances and minimize or reduce deviations in the magnetic field transmission from pole to pole.

The on-axial magnetic field of each magnetic pole in an aberration corrector is inter alia determined by the connection between the yoke, also referred to as ring in the present disclosure, the magnetic rod and the magnetic pole. Differences in the connection joints between the parts lead to a variance of magnetic field transmitted to the optical axis.

The complexity of the assembly results in an angular and positional tolerance between the magnetic rod and the magnetic pole, i.e. between the magnetic rod and the magnetic pole of each magnetic element. A solid connection (e.g. a thread) may result in mechanical stress to the magnetic poles that can in turn result in undesired physical movement of a magnetic pole. Mechanical stress can further result in an undesired change of the magnetic properties of the poles, e.g. change the magnetic domain structure of the poles. The physical movement or the different magnetic properties can influence the magnetic field on the axis. A contactless connection results in a small gap between the magnetic rod and the magnetic pole. A deviation of the gaps between one magnetic element and another magnetic element may also lead to a deviation of the field between the magnetic poles.

According to embodiments of the present disclosure, the magnetic rod has a semi-spheroidal tip, particularly a semi-spherical tip, that touches the magnetic pole on a flat surface. According to a further embodiment, the magnetic rod touches the magnetic pole on a surface with a larger radius, i.e. smaller curvature, then the tip radius. With a connection joint according to embodiments of the present disclosure, the distances between the rod and the pole head at each point of the rod tip surface are similar (except for machining tolerances of the radius) from pole to pole, particularly independent on any angular or positional tolerance.

Embodiments advantageously overcome magnetic pole to magnetic pole deviations in the magnetic field transmission between the magnetic rod and the magnetic pole, which may be caused by angular or positional tolerances of the system without introducing mechanical stress to the magnetic poles. The amount of adjustment to compensate for a disturbed magnetic field distribution on the optical axis in the multipole can be decreased.

Correcting spherical and chromatic aberrations of charged particle beam apparatuses can lead to an improvement in resolution or current density and therefore generally improve the performance of charged particle beam apparatuses, including electron beam microscopes, such as scanning electron beam microscopes (SEMs).

According to an aspect, an aberration corrector including a first plurality of magnetic elements is provided. Each magnetic element including a magnetic pole and a corresponding magnetic rod for providing a magnetic field to the magnetic pole. The first plurality of magnetic elements includes at least a first magnetic element, the first magnetic element including a first magnetic pole, a first magnetic rod having a proximal end adjacent to a magnetic pole and a distal end opposite the proximal end, the proximal end having a tip with a tip surface in the shape of a semi-spheroid and a contact point of the tip surface contacts the magnetic pole. According to some embodiments, which can be combined with other embodiments described herein, the first magnetic rod or further magnetic rods can be formed integrally, i.e. as one part, or can be formed from two or more parts, e.g. a first rod portion and a second rod portion.

An aberration corrector according to embodiments described herein including a first magnetic element allows to minimize or reduce deviations in the magnetic field provided to the optical axis by the magnetic pole. This is achieved by minimizing deviations during positional alignment of the first magnetic rod to the first magnetic pole.

FIG. 1 shows a view of an aberration corrector 100 according to embodiments described herein. The aberration corrector 100 includes a first plurality of magnetic elements 105 and a ring 180. The plurality of magnetic elements are homogenously distributed around a center axis 110. The first plurality of magnetic elements can be arranged in a same plane or a common plane. The distribution can be such that the magnetic elements have same angle between each two magnetic elements and are centered around the center axis 110. In particular, the magnetic elements can be arranged in a star-like shape oriented around the center axis 110. The magnetic elements have equal radial distance to the center axis and may have, for example, equal angles between each two neighboring magnetic elements. The magnetic elements may be aligned to form an opening of the aberration corrector, particularly wherein the opening being concentric with the center axis. The opening may be aligned with the optical axis of a charged particle beam apparatus, an SEM, and/or an objective lens.

The aberration corrector can include a first plurality of magnetic elements 105, such as 8 magnetic elements for an 8-pole or 12 magnetic elements for a 12-pole. The aberration corrector can include any number n of magnetic elements to form an n-pole, for example, 4, 6, 8, 10, 12 or more. Throughout this application, the individual magnetic elements of the first plurality of magnetic elements 105 are further numbered with letters to provide better distinguishability for the individual magnetic elements. For example, the magnetic elements of an 8-pole can be donated as magnetic element 105*a*, 105*b*, 105*c*, 105*d*, 105*e*, 105*f*, 105*g* and 105*h* and the magnetic elements of a 12-pole can be donated as 105*a*, 105*b*, 105*c*, 105*d*, 105*e*, 105*f*, 105*g*, 105*h*, 105*i*, 105*j*, 105*k* and 105*l*. One magnetic element, throughout this disclosure the magnetic element 105*a*, is referred to as the first magnetic element. The further magnetic elements can be referred to as second magnetic element 105*b*, third magnetic element 105*c*, fourth magnetic element 105*d* and so forth. Particularly, the magnetic elements of the first plurality of magnetic elements 105 other than the first magnetic element 105*a* are referred to as a further magnetic element 105*x*. Throughout this disclosure reference will be provided to the first magnetic element 105*a* and the first magnetic element 105*a* will be described in detail. It is to be understood that further magnetic elements 105*x* can be similar, particularly of identical construction, as the first magnetic element 105*a*.

The first magnetic element 105*a* includes a first magnetic pole 120 and a first magnetic rod 130. The first magnetic rod 130 contacts the first magnetic pole 120. A magnetic field can be provided from the first magnetic rod 130 to the first magnetic pole 120. The first magnetic rod 130 has a first axis 135 in the length direction of the first magnetic rod 130. The first magnetic rod 130 can be arranged such that an extension of the first axis 135 crosses the center axis 110. A first excitation coil 170 can be disposed on the first magnetic rod 130. The magnetic field can be provided by the first excitation coil 170. The magnetic field can be provided to the first magnetic rod 130.

The first plurality of magnetic elements 105 provide a magnetic circuit. The magnetic circuit can be closed by a ring 180. The ring 180 may be understood as a magnetic yoke. The ring 180 can surround a first plurality of magnetic elements 105. In one embodiment, a foil 185 is placed between the ring 180 and each magnetic element of the plurality of magnetic elements. The foil 185 is electrically isolating the ring and each magnetic element of the first plurality of magnetic elements from each other. The magnetic elements can be in direct contact with the foil 185 and the foil can be in direct contact with the ring 180 to provide a constant alignment of the magnetic elements to the ring 180. The first magnetic rod 130 can be in direct contact with the foil 185 and the first magnetic pole. The first magnetic rod 130 can be fixed between the foil 185 and the first magnetic rod 130. Particularly, the first magnetic rod 130 can be clamped between the foil 185 and the first magnetic pole. In another embodiment the ring is placed with an air gap between each magnetic element and the ring 180. The air gap may be in the order of millimeters. The air gap can be constant for each magnetic element of the plurality of magnetic elements. In one embodiment, which can be combined with other embodiments described herein, the aberration corrector further includes a ring that magnetically connects the first plurality of magnetic elements 105 with one another. The ring magnetically connects the first magnetic element 105*a* and the further magnetic elements 105*x* with each other.

The magnetic elements of the first plurality of magnetic elements 105 provide for a magnetic n-pole, where n can be 4, 6, 8, 10, 12 or higher orders. That is, the magnetic elements of the first plurality of magnetic elements 105 can provide for a magnetic 4-pole, 6-pole, 8-pole, 10-pole, 12-pole or higher order pole. FIG. 1 shows an aberration corrector including 12 magnetic elements forming a 12-pole. The magnetic n-pole includes a center opening, particularly a center opening corresponding to an opening of the aberration corrector. The center opening is configured to be aligned with an optical axis 109. The first magnetic element 105*a* can be arranged such that an extension of the first axis 135 crosses the center axis 110. The further magnetic elements 105*x* can be arranged such that further axis crosses the center axis 110. The magnetic elements are oriented with the magnetic poles towards the center of the star-like shape. The magnetic elements have a constant angle α to each other. The constant angle is dependent on the number of magnetic elements and can be determined by the formula α=360°/n. In one embodiment, which can be combined with other embodiments described herein, the first plurality of magnetic elements includes 8 magnetic elements forming an 8-pole or 12 magnetic elements forming a 12-pole. The first plurality of magnetic elements may include 6 magnetic elements forming a 6-pole.

Figures 2A, 2B, 2C:
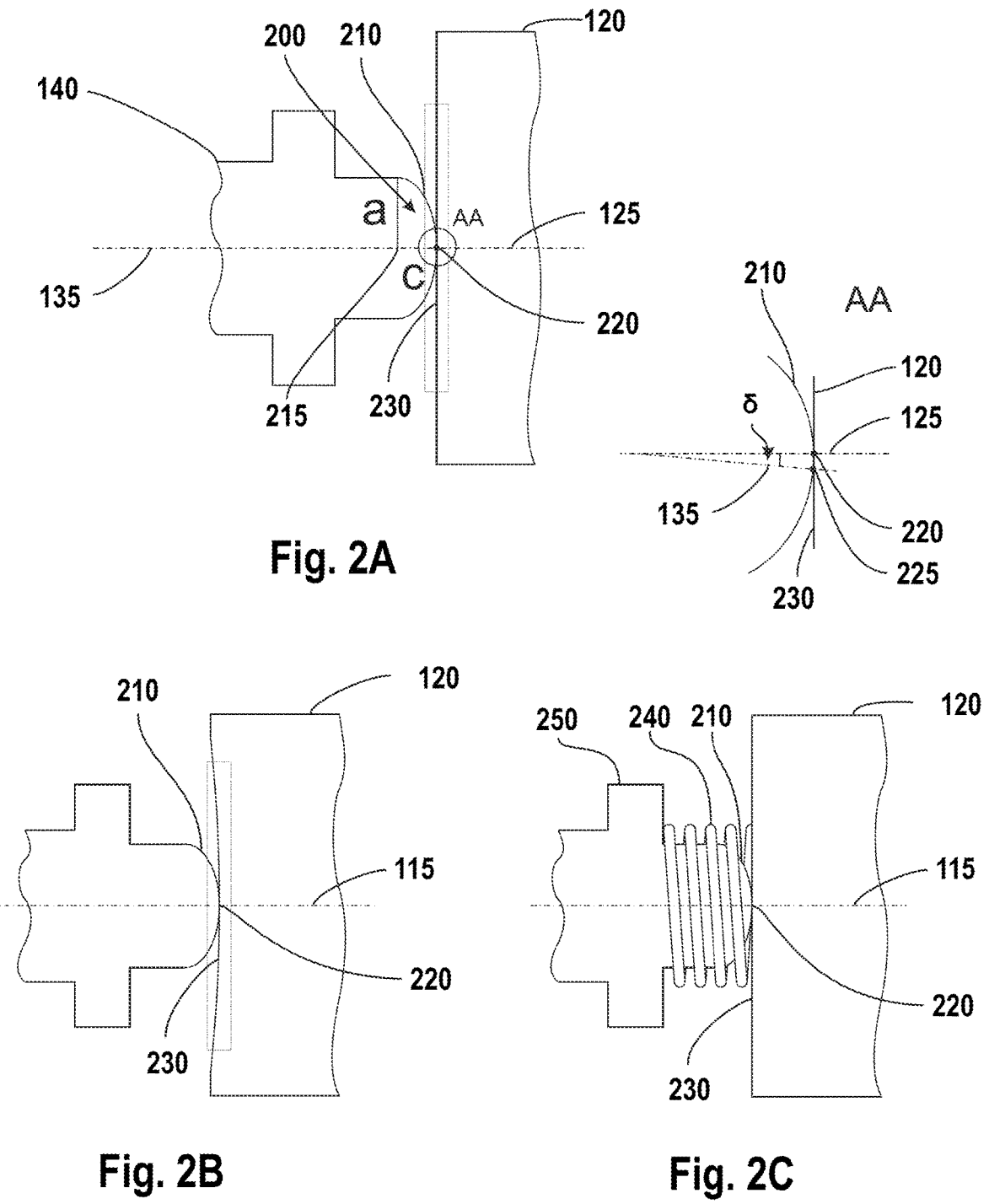
FIG. 2A is a section view of a tip of a magnetic rod of an aberration corrector according to embodiments described herein.
FIG. 2B is a section view of a tip of a magnetic rod of an aberration corrector according to embodiments described herein.
FIG. 2C is a section view of a tip of a magnetic rod of an aberration corrector according to embodiments described herein.

The magnetic field provided by the first magnetic rod 130 to the first magnetic pole 120 is dependent on the alignment of the first magnetic rod 130 to the first magnetic pole 120. The first magnetic rod 130 has a proximal end 140 adjacent to the first magnetic pole 120 and a distal end 150 opposite the proximal end. The proximal end 140 has a tip 200 contacting the first magnetic pole 120. FIG. 2A is a detailed view of the tip 200 contacting the first magnetic pole 120. The tip 200 has a tip surface 210 in the shape of a semi-spheroid. Throughout this application, the term semi-spheroid typically refers to any spheroid having a polar angle of less than 360°, i.e. being not a complete spheroid.

The tip surface 210 is in the shape of a semi-spheroid. The tip can be a convex tip, in particular has the shape of a convex semi-spheroid. The center 215 of the semi-spheroid can be located on the first axis 135 of the first magnetic rod 130. The semi spheroid has a first semi axis a, a second semi axis b and a third semi axis c. As shown in FIG. 2A, the first semi axis and the third semi axis c are in the paper plane and perpendicular to each other. The second semi axis b (not shown) is out of the paper plane and perpendicular to the first semi axis a and perpendicular to the third semi axis c. The first semi axis a and the second semi axis b are identical in length. The third semi axis c is aligned with the axis 135. In embodiments the semi-spheroid is a semi-sphere and the third semi axis c is identical in length to the first semi axis a and the second semi axis b.

The opening angle of the semi-spheroid can be equal to 180°. The radius of the first magnetic rod 130 adjacent the tip 200 is then equal to the length of the first semi axis a. The center of the opening is located at a contact plane of the tip 200 and the first magnetic rod 130. The opening angle of the semi-spheroid can be less than 180°. The radius of the first magnetic rod 130 adjacent the tip 200 is then less than the length of the first semi axis a. The center 215 is located inside the first magnetic rod 130. The semi-spheroid can have an opening angle more than 180°. The radius of the first magnetic rod 130 adjacent the tip 200 is then less than the length of the first semi axis a. The center 215 is located inside the tip 200.

A contact point 220 of the tip surface contacts the magnetic pole 120. The contact point 220 contacts the magnetic pole 120 on a contact surface 230. The contact point 220 is the point where the tip surface 210 contacts the contact surface 230. The contact surface is a surface, for example, a flat surface as shown in FIG. 2A or a surface with a curvature as shown in FIG. 2B, having an area provided for the contact point 220 of the magnetic rod and the magnetic pole. The contact surface is indicated by the dotted lines in FIGS. 2A and 2B. The first magnetic rod 130 has the first axis 135. The first magnetic pole 120 with the contact surface 230 has a surface normal 125. The surface normal is determined at the point on the contact surface 230 where the contact point 220 contacts the contact surface 230. The surface normal is determined at the contact point 220. As illustrated in the detailed view AA in FIG. 2A, the first magnetic rod 130 can have a deviation angle δ to the first magnetic pole 120. The deviation angle δ is determined as the angle of the first axis 135 to the surface normal 125. For a deviation angle δ equal 0° the contact point 220 is at the intersection of the first axis 135 with the tip surface 210, referred to as the apex point 225 of the tip. For δ unequal 0, the contact point 220 will be shifted away from the apex point 225. While the detailed view AA is in two-dimensions it is understood that the first magnetic rod 130 can have a further angular deviation to the first magnetic pole in a second direction, for example, in the direction into the drawing plane.

As can be seen in detailed view AA, for small deviation angles δ, the tip in the shape of a semi-sphere can compensate the angular deviations. The first magnetic rod 130 contacts the first magnetic pole 120 in the contact point 220. Two points located diametrically opposite the contact point have the same distance to the surface of the first magnetic pole 120. The tip can compensate angular deviations for deviation angles δ of up to 0.5°, up to 1° or up to 2°.

As shown in FIG. 2A and detailed view AA, the contact surface 230 of the first magnetic pole 120 can have a zero curvature (0 1/m), i.e. the contact surface 230 of the first magnetic pole 120 can be flat. The contact surface 230 of the first magnetic pole can have a curvature as shown in FIG. 2B. In an embodiment, which can be combined with other embodiments described herein, the contact point of the tip surface contacts the magnetic pole at a contact surface of the magnetic pole, and the contact surface has a curvature smaller than a tip curvature of the tip surface.

FIG. 2B shows an embodiment including a contact surface 230 having a curvature. The curvature of the contact surface 230 is at least 3 times smaller than the curvature of the tip surface 210. The cross-sectional area of the contact surface can have an area in the shape of a circle with a radius larger than the length of the first semi axis a. The cross-sectional area of the contact surface can be of other shape having a similar size.

The contact surface 230 can be in the shape of a semi-spheroid. In particular, the contact surface 230 can be in the shape of a concave semi-spheroid. The tip surface 210 can have the shape of a semi-spheroid and the contact surface 230 can have the shape of a semi-spheroid. The tip surface 210 can have the shape of a semi-spheroid and the contact surface 230 can have the shape of a semi-sphere. The tip surface can have the shape of a semi-sphere and the contact surface can have the shape of a semi-sphere. The tip surface can have the shape of a semi-sphere and the contact surface can have the shape of a semi-spheroid.

The curvature of the contact surface 230 can provide guidance for the contact point of the tip surface. The contact surface can include an apex point corresponding to the point of the contact surface 230 farthest inside the first magnetic pole. A first magnetic rod 130 contacting a first magnetic pole 120 including the contact surface 230 in the shape of a semi-spheroid can be guided to the apex point of the contact surface. The contact surface 230 in the shape of a semi-spheroid advantageously provides that the contact point of the first magnetic rod 130 can be guided to a predetermined location, i.e. the apex point of the contact surface. The contact point 220 of the first magnetic rod 130 contacts the first magnetic pole 120 close to or at the apex point of the contact surface.

Typical embodiments of the first magnetic element 105a and the further magnetic element 105x include a tip surface in the shape of a semi-sphere and a contact surface in the shape of a semi-spheroid. The geometry of the tip surface and the contact surface advantageously provides for alignment of the first magnetic rod 130 to the first magnetic pole 120. In particular, the geometry of the tip surface provides for an automatic alignment of the first magnetic rod 130 to the first magnetic pole 120 for tilt angles of the first magnetic rod 130 to the first magnetic pole 120. The first magnetic rod 130 contacts the first magnetic pole 120 in the contact point 220. Two points located diametrically opposite the contact point have the same distance to the surface of the first magnetic pole 120. The tip can compensate angular deviations for deviation angles δ of up to 0.5°, up to 1° or up to 2°.

The first magnetic rod 130 and the first magnetic pole are magnetically connected, particularly at the contact point 220, and a magnetic field can be provided by the first magnetic rod 130 to the first magnetic pole 120. The first magnetic rod 130 and the first magnetic pole 120 can be electrically connected through the contact point 220. An electric voltage can be provided to the first magnetic rod 130. The first magnetic rod can provide the electric voltage through the contact point 220 to the first magnetic pole 120. An additional electrical connection between the first magnetic rod 130 and the first magnetic pole 120 can be provided.

According to some embodiments, which can be combined with other embodiments, described herein, an electrical voltage can be applied to the first magnetic rod and the further magnetic rod to provide a voltage to the plurality of magnetic rods. Particularly, the plurality of magnetic poles may provide a plurality of electrodes that can be biased by the voltages. Biasing the plurality of electrodes of the aberration corrector may form an electrostatic multipole.

FIG. 2C shows an embodiment including a spring 240. The additional electrical connection can be provided by the spring. The spring 240 is disposed on the proximal end 140 of the first magnetic rod 130. The spring can be disposed between the contact surface 230 and a protruding portion 250 of the first magnetic rod. Throughout the disclosure, a spring is understood as an elastic object that stores mechanical energy, i.e. any elastic connector. Particularly an elastic connector that allows positional adaptation between rod and pole while maintaining electrical connection. The spring advantageously has a high electrical conductivity.

When the first magnetic rod 130 is in contact with the first magnetic pole 120 the spring 240 is tensioned between the contact surface 230 and the protruding portion 250. The spring 240 can be preloaded between the contact surface 230 and the protruding portion 250. The preloaded spring provides an electrical connection between the first magnetic rod 130 and the first magnetic pole 120. Preloading the spring advantageously allows for reliable and/or continuous contact of the spring to the protruding portion 250 and the contact surface 230. The preloaded spring 240 provides for a reliable and continuous electrical connection between the first magnetic rod 130 and the first magnetic pole 120.

In an embodiment, which can be combined with other embodiments described herein, the first magnetic element includes a spring at the proximal end contacting the surface of the magnetic pole to provide an electrical connection between the magnetic rod and the magnetic pole.

Figure 3A:
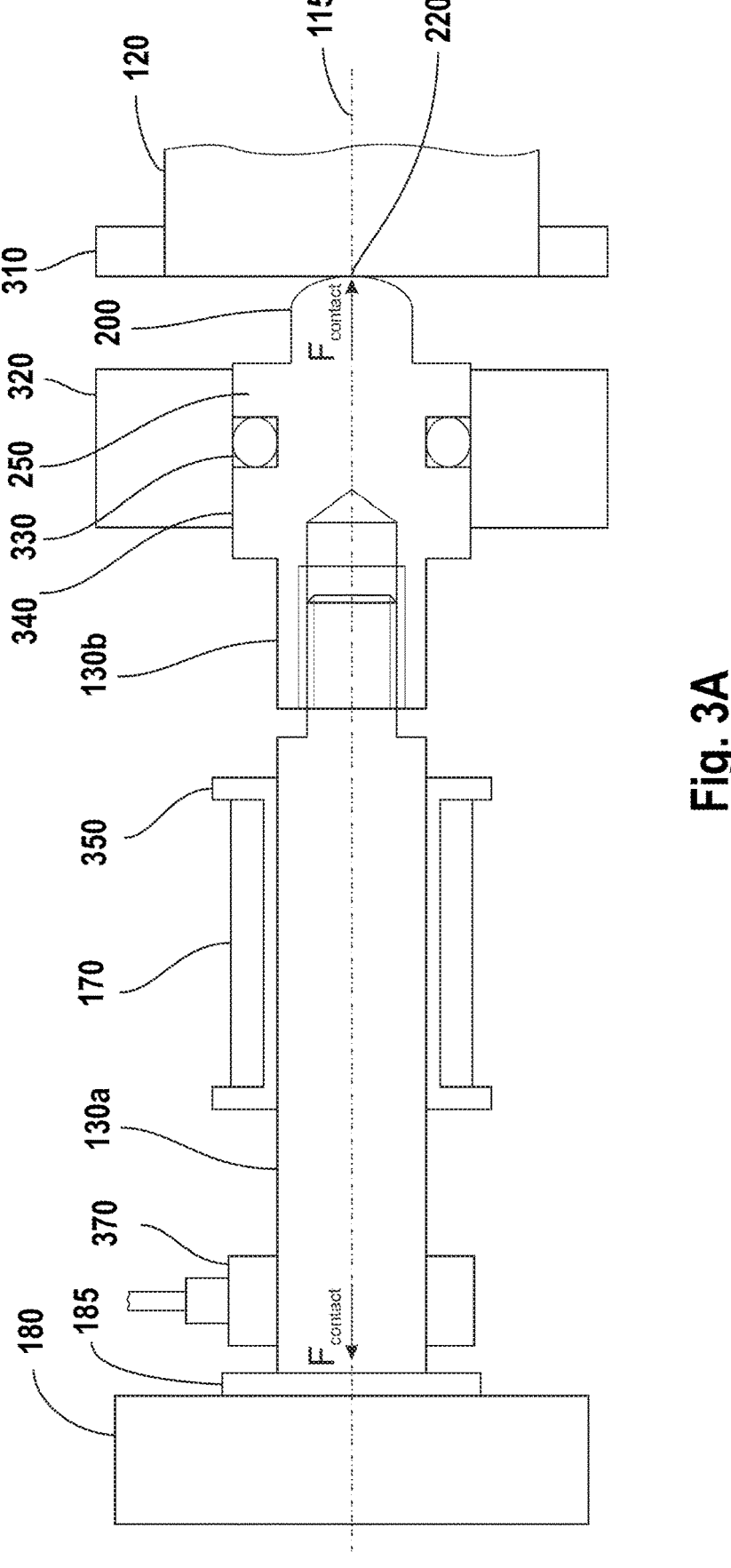
FIG. 3A is a section view of a first magnetic element of an aberration corrector according to embodiments described herein.

FIG. 3A is a sectional view of the first magnetic element 105a. The first magnetic element 105a includes the first magnetic pole 120 and the first magnetic rod 130. As can be seen in FIG. 3, the first magnetic rod 130 contacts the first magnetic pole 120. The contact point 220 of the tip 200 of the first magnetic rod 130 contacts the first magnetic pole 120. The contact point 220 contacts the contact surface of the first magnetic pole 120. The distal end of the first magnetic rod 130 contacts the foil 185 placed between the first magnetic rod 130 and the ring 180.

The first magnetic rod 130 can be formed of a first rod element 130a and a second rod element 130b. The first rod element 130a and the second rod element 130b can have a thread connection. The first rod element 130a can have a male thread and the second rod element 130b a female thread. The first rod element 130a can have a female thread and the second rod element 130b a male thread. The first rod element 130a and the second rod element 130b can be screwed apart. A contact force $F_{contact}$ on the magnetic pole and the foil 185 can be adjusted. The contact force $F_{contact}$ can be in the range of 5 N to 500 N, particularly in the range of 10 N to 100 N.

Figure 3B:
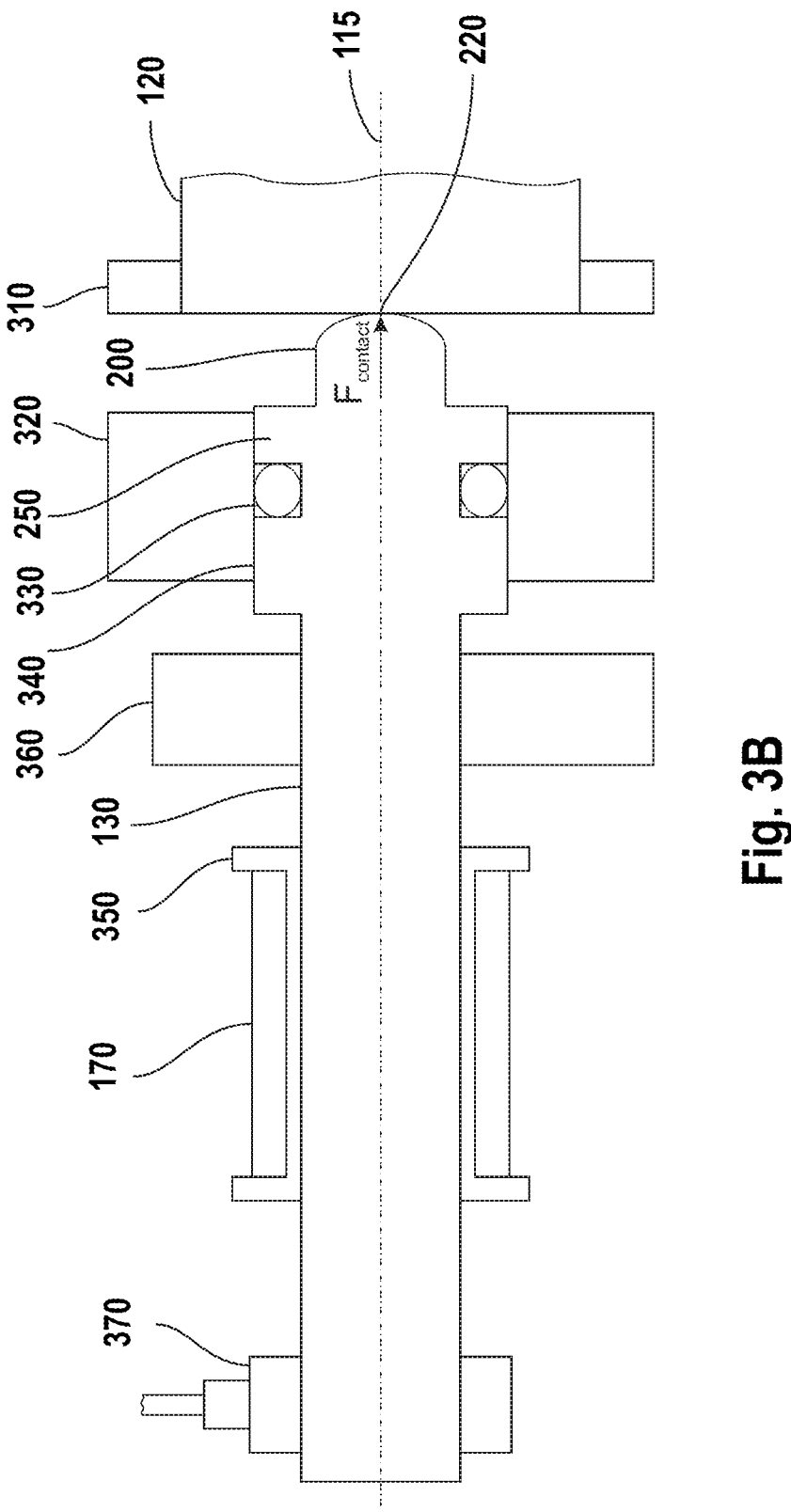
FIG. 3B is a section view of a first magnetic element of an aberration corrector according to embodiments described herein.

FIG. 3B is a sectional view of the first magnetic element 105a similar to the embodiment provided in FIG. 3A. The first magnetic rod 130 is formed integrally and the contact force is provided by a pressing element 360. The pressing element 360 is configured to apply a pressing force $F_{press}$ to the first magnetic rod. The first magnetic rod contacts the first magnetic pole with a contact force $F_{contact}$. The contact force $F_{contact}$ can be substantially equal to the pressing force $F_{press}$. The pressing element 360 can be configured to adjust the contact force $F_{contact}$. The pressing element can include a thread (not shown). The pressing element can include other methods for adjusting the contact force, for example the pressing element can clamp the first magnetic rod 130 and apply a force along axis 135 to adjust the contact force. The magnetic rod 130 can be in contact with the foil 185 at a distal end of the magnetic rod. The magnetic rod being in contact with the foil has the advantage of a defined magnetic properties that can be well controlled. Alternatively, an air gap may be provided between the magnetic rod 130 and the ring 180. In one embodiment, which can be combined with other embodiments described herein, the aberration corrector includes a pressing element configured to adjust a contact force between the first magnetic rod and the first magnetic pole. In particular, the pressing element can be configured to adjust the contact force between the first magnetic rod and the first magnetic pole in the range of 5 N to 500 N, particularly in the range of 10 N to 100 N. A pressing element 360 can be provided for each magnetic element of the first plurality of magnetic elements 105.

With reference to FIG. 3A, the first magnetic rod 130 is supported in a support structure 320. The support structure 320 supports the first magnetic rod 130. The support structure 320 fixates the position of the first magnetic rod 130 in the aberration corrector 100. The support structure 320 can fixate the position of the first magnetic rod 130 relative to a position of the first magnetic pole 120. Further support structures can be provided for the further magnetic elements 105x. The pressing element 360 can be formed integrally with the support structure 320. For example, the support structure and the magnetic rod may have a threaded connection to adjust the contact force.

The support structure 320 can be formed integrally with the further support structures. The integrally formed support structure 320 fixates the positions of the first magnetic rod 130 of the first magnetic element 105a and further magnetic rods of the further magnetic elements 105x to each other. For example, for an 8- or 12-pole the integrally formed support structure can provide the magnetic rods in a star-shaped structure having equal angles between each magnetic rod of 45° or 30°, respectively, and providing an opening in the center of the star. In one embodiment, which can be combined with other embodiments described herein, the aberration corrector includes a support configured to support at least the first magnetic rod.

The support structure 320 can be made of plastic, ceramic, glass or any other non-magnetic and electrically isolating material. The support structure 320 can provide a vacuum feedthrough 340. In particular, the integrally formed support structure can provide a vacuum feedthrough. The first magnetic pole 120 can be located inside a vacuum enclosure. Further magnetic poles of each of the magnetic elements can be located inside the vacuum enclosure. The vacuum feedthrough can include a sealant ring 330, particularly proximate the proximal end 140. The sealant ring 330 can be located in a recessed portion of the protruding portion 250 or the first magnetic rod. The sealant ring 330 can be located in a recessed portion of the support structure. The sealant ring 330 can contact the inner wall of the vacuum feedthrough 340 and provide a vacuum seal. Further vacuum feedthroughs can be provided for further magnetic rods of the plurality of magnetic elements. In one embodiment, which can be combined with other embodiments described herein, the aberration corrector includes a support configured to support at least the first magnetic rod and the support includes a vacuum feedthrough for the first magnetic rod.

Machining tolerances can result in a gap or leeway between the outer surface of the first magnetic rod 130 and the inner surface of the vacuum feedthrough. The gap or leeway can result in the first magnetic rod 130 being fixated at an angle to the first magnetic pole resulting in the deviation angle δ. The aberration corrector of the present application advantageously provides that angular deviations between the first magnetic rod 130 and the first magnetic pole 120 are compensated by the geometry of the tip. Deviations of magnetic field provided to the magnetic pole 120 and the optical axis 109 can be minimized.

A first excitation coil 170 can be mounted on the first magnetic rod 130. The first excitation coil 170 can provide a magnetic field to the first magnetic rod 130. The first excitation coil 170 is electrically isolated from the first magnetic rod 120. The first excitation coil 170 can be wound on a first carrier 350. The first carrier is electrically insulating. The first carrier can be made from polyether ether ketone (PEEK), ceramic or any other suitable insulating material. The first carrier 350 can be mounted on the first magnetic rod 130. The first carrier 350 can be mounted such that the support structure 320 is between the proximal end and the first carrier along axis 135. The first carrier 350 can be mounted such that the pressing element 360 is between the proximal end and the first carrier along axis 135. The pressing element 360 can be formed integrally with the first carrier 350. The support structure 320, the first carrier 350 and the pressing element 360 can be formed integrally. The first carrier electrically isolates the first excitation coil 170 and the first magnetic rod 130. The first carrier is not magnetically isolating the first excitation coil 170 and the first magnetic rod 130. In particular, the first excitation coil 170 wound on the first carrier 350 and mounted on the first magnetic rod 130 provides the magnetic field to the first magnetic rod 130. In one embodiment, which can be combined with other embodiments described herein, the first magnetic element includes a first excitation coil disposed on the magnetic rod. In particular, the first excitation coil is wound on a first carrier.

The first magnetic rod 130 can include a first electric connector 370. The first electric connector 370 can electrically connect the magnetic rod 130 to a voltage source. An electrical voltage can be applied to the first magnetic rod 130 through the first electrical connector 370. The first electrical connector can be disposed on the first magnetic rod 130. The first electrical connector can be disposed adjacent the distal end. The first electric connector 370 can be arranged between the first excitation coil and the distal end of the first rod along the length of the rod. The first electrical connector can be a nut configured to provide an electrical connection to the magnetic rod. In one embodiment, which can be combined with other embodiments described herein, the first magnetic element includes a first electrical connector connected to the first magnetic rod adjacent the distal end.

An assembly ring 310 can be provided. The first magnetic pole 120 can be attached to the assembly ring 310 to support the first magnetic pole 120. The assembly ring can be stiff to fixate the position of the first magnetic pole 120. The further magnetic poles can be attached to the assembly ring 310. Particularly, each magnetic pole of the first plurality of magnetic elements 105 can be attached to the assembly ring 310. The assembly ring 310 can support the first magnetic pole 120 and the further magnetic poles. The assembly ring 310 can fixate the position of the first magnetic pole 120 and the further magnetic poles to each other. In one embodiment, which can be combined with other embodiments described herein, each magnetic pole of the first plurality of magnetic elements is attached to an assembly ring. The assembly ring 310 can be a ceramic ring. The first magnetic pole 120 can be attached to the ceramic ring by an adhesive connection. Particularly, the first magnetic pole 120 can be glued to the assembly ring 310. The further magnetic poles can be attached to the ceramic ring by an adhesive connection, particularly glued to the assembly ring. The assembly ring 310 can be a plastic compound ring. The first magnetic pole 120 can be molded into the plastic compound ring. The further magnetic poles can be molded in the plastic compound.

The plastic compound 310 can arrange the magnetic poles of the first plurality of magnetic elements 105 in a star-like shape. In particular, in a star-like shape similar to the star-like shape of the magnetic rods arranged by the support structure 320. The plastic compound 310 can arrange the magnetic poles in a star-like shape with equal angles between each magnetic pole of 45° or 30°, respectively for an 8- or 12-pole, and centered around an opening in the center of the star. The opening in the center of the star-like shape can be configured to be aligned with an optical axis 109. The plastic compound 310 with each magnetic pole of the first plurality of magnetic elements 105 molded into can be placed inside the center opening of the star-like shape of the integrally formed support structure 320. Each magnetic pole can be aligned with the corresponding magnetic rod simultaneously.

Figure 4:
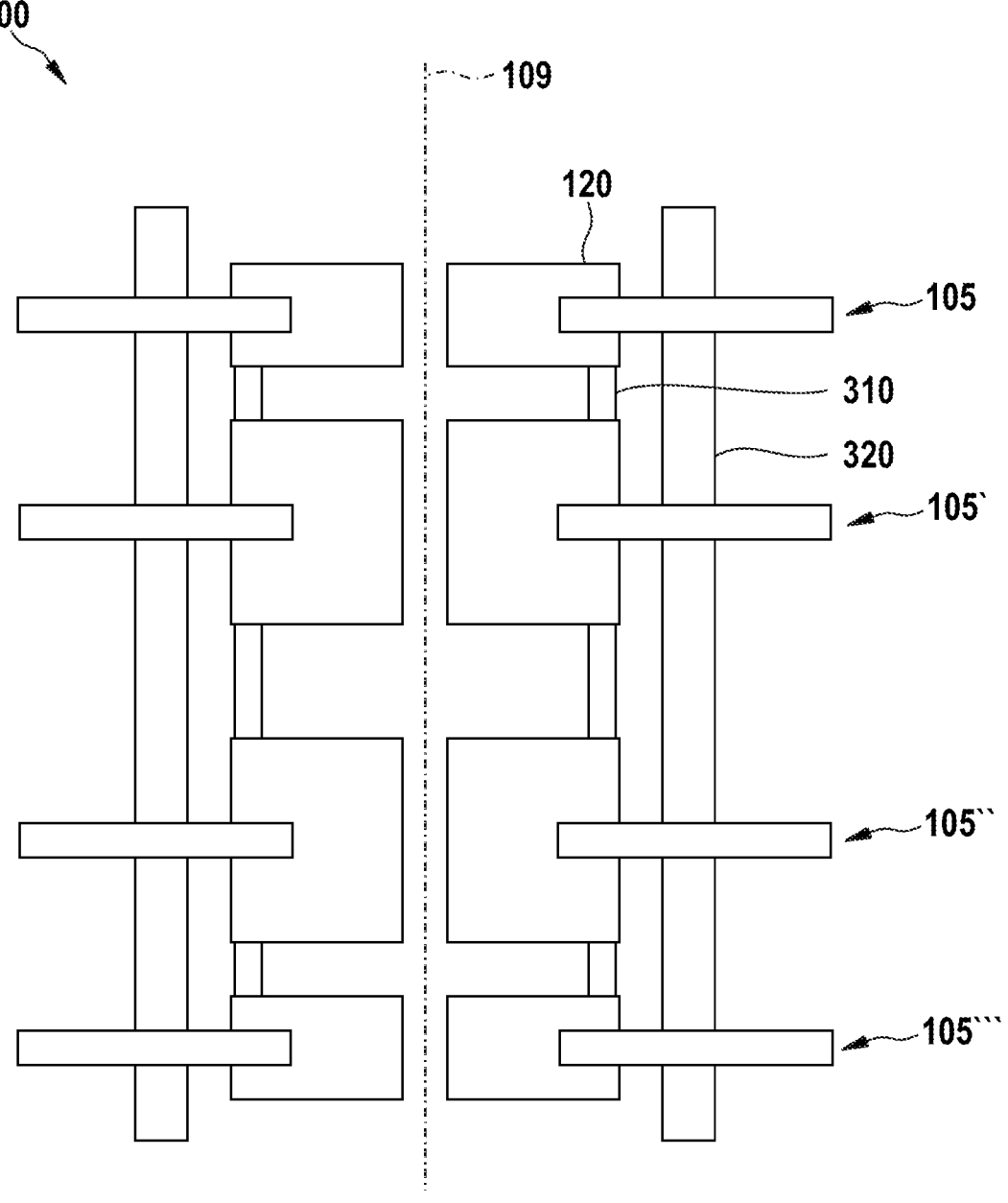
FIG. 4 is a section view of an aberration corrector including multiple stages each having a plurality of magnetic elements according to embodiments described herein.

FIG. 4 shows an embodiment of an aberration corrector with further pluralities of magnetic elements. The aberration corrector includes a first plurality of magnetic elements 105 as described herein and further pluralities of magnetic elements 105', 105" and 105"". The further pluralities of magnetic elements 105', 105" and 105''' can be of similar or identical structure and arrangement as the first plurality of magnetic elements. The first plurality of magnetic elements 105 and the further plurality of magnetic elements 105', 105" and 105''' can be stacked on top of each other. The first plurality of magnetic elements can form a first magnetic n-pole, for example, a 4-, 6-, 8-, 10- or 12-pole or pole of higher order which is aligned with an optical axis 109. The further plurality of magnetic elements 105', 105" and 105''' can form a similar n-pole aligned with an optical axis 109.

In one embodiment, which can be combined with other embodiments described herein, the aberration corrector includes a second stage including a second plurality of magnetic elements, each magnetic element of the second plurality of magnetic elements including a magnetic pole and a corresponding magnetic rod for providing a magnetic field to the magnetic pole, wherein a first stage includes the first plurality of magnetic elements and the second stage is stacked over the first stage.

The second plurality of magnetic elements can be substantially similar to the first plurality of magnetic elements. The second plurality of magnetic elements can include the same number of magnetic elements as the first magnetic elements. The second plurality of magnetic elements can include a first magnetic element similar to the first magnetic element of the first plurality of magnetic elements. The first magnetic element of the second plurality of magnetic elements can include a first magnetic pole, a first magnetic rod having a proximal end adjacent to a magnetic pole and a distal end opposite the proximal end, the proximal end having a tip with a tip surface in the shape of a semi-spheroid, and a contact point of the tip surface contacts the first magnetic pole. Further magnetic elements of the second plurality of magnetic elements can be similar to the first magnetic element of the first plurality of magnetic elements. The second stage can be similar or identical to the first stage.

According to an aspect, a charged particle beam apparatus is described. The charged particle beam apparatus including a sample stage, a charged particle source adapted to generate a charged particle beam and a charged particle beam manipulation system including the aberration corrector according to embodiments described herein.

Figure 5:
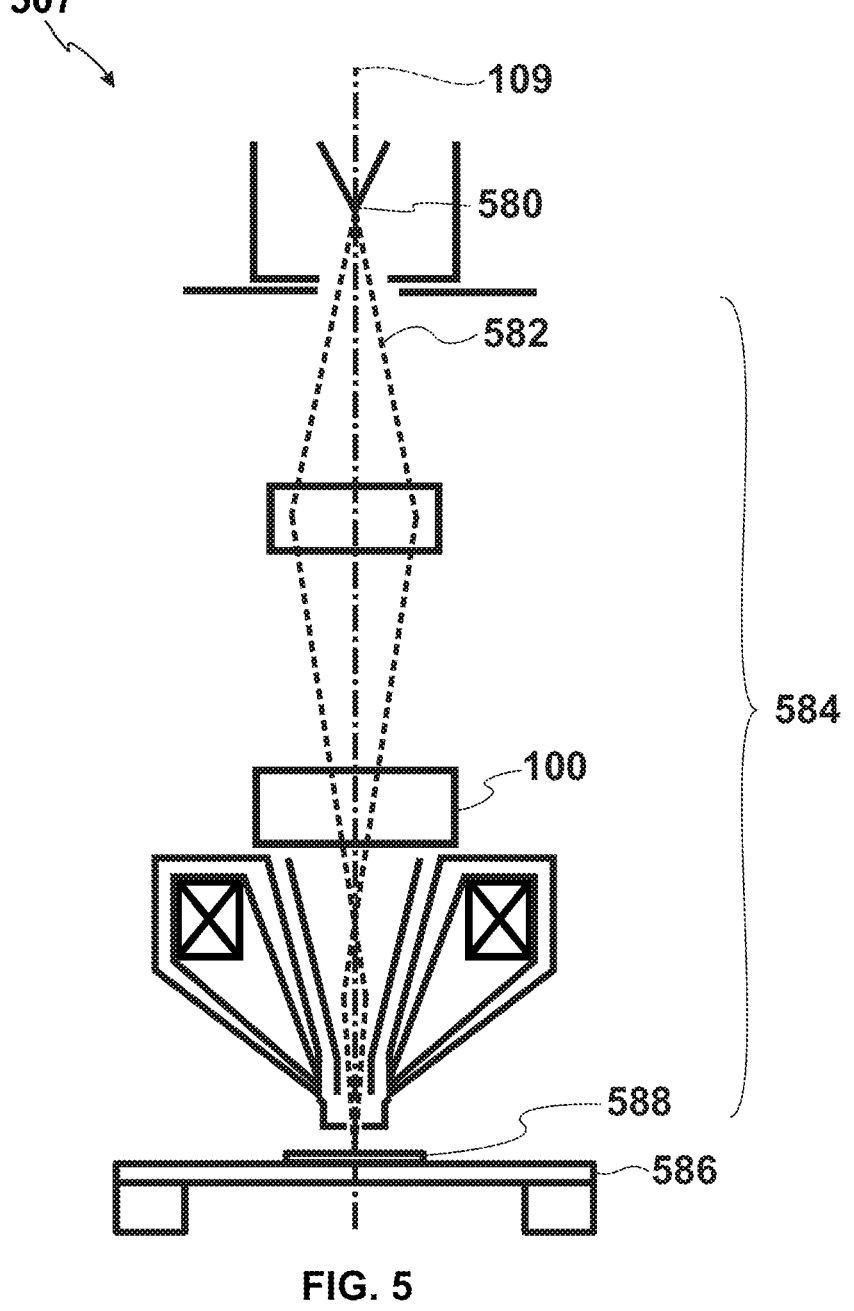
FIG. 5 is a schematic illustration of a charged particle beam apparatus according to embodiments described herein.

Referring now to FIG. 5, a schematic illustration of a charged particle beam apparatus is shown. As shown, the charged particle beam apparatus 507 includes a charged particle source 580, sample stage 586 and a charged particle beam manipulation system 584 including an aberration corrector 100. As illustrated, the charged particle source 580 is adapted to generate a charged particle beam 582. As seen, the sample stage 586 is adapted to support a sample 588. Illustrated is the optical axis 109. The optical axis 109 may be understood to be the optical axis 109 of a charged particle beam apparatus 507.

According to an aspect, a method of aligning an aberration corrector is provided. The method includes providing a plurality of magnetic poles, the magnetic poles having a predetermined alignment, and contacting the plurality of magnetic poles with a plurality of magnetic rods, wherein each of the plurality of magnetic rods is connected to a corresponding magnetic pole such that the predetermined alignment of the plurality of magnetic poles is substantially maintained or maintained.

The predetermined alignment can be in the shape of an n-pole for n magnetic poles. For example, the predetermined alignment can be in the shape of a 4-, 6-, 8-, 10-, 12-pole for 4-, 6-, 8-, 10-, 12 magnetic poles. The predetermined alignment of the magnetic poles may be a star-like shape oriented around a center axis. The magnetic poles may have equal radial distance to the center axis and may have equal angles between each two neighboring magnetic poles. The magnetic poles may be aligned to form an opening of the aberration corrector, the opening being concentric with the center axis. Maintaining the predetermined alignment includes maintaining equal radial distance to the center axis for each magnetic pole and maintaining equal angles between each two neighboring magnetic poles.

Figure 6:
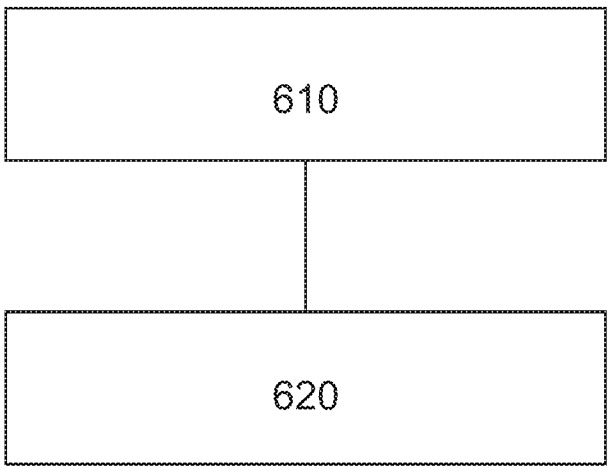
FIG. 6 is a flow diagram illustrating a method of aligning an aberration corrector according to embodiments described herein.

Referring now to FIG. 6, a flow diagram illustrating a method of aligning an aberration corrector is shown. At step 610 a plurality of magnetic poles is provided, the magnetic poles having a predetermined alignment. The predetermined alignment may be in the shape of an n-pole or the star-like shape. At step 620 the plurality of magnetic poles is contacted with a plurality of magnetic rods. Each of the plurality of magnetic rods is connected to a corresponding magnetic pole such that the predetermined alignment of the plurality of magnetic poles is maintained or substantially maintained.

According to an embodiment, which can be combined with further embodiments described herein, the method of aligning an aberration corrector includes pressing a tip surface of a first magnetic rod in the shape of a semi-spheroid onto a contact surface of a first magnetic pole. The tip in the shape of a semi-spheroid can compensate small deviation angles δ between an axis of the first magnetic rod and a surface normal of the first magnetic pole. Two points located diametrically opposite the contact point have the same distance to the surface of the first magnetic pole.

According to an embodiment, which can be combined with further embodiments described herein, the method of aligning an aberration corrector includes moving at least one magnetic rod of the plurality of magnetic rods during contacting of the corresponding magnetic poles with essentially no movement of the corresponding magnetic pole. The magnetic rod may, for example, move with an angular displacement during mounting of the magnetic rod building the corrector. During mounting of the plurality of magnetic rods, an angular displacement of one or more of the magnetic rods may occur. According to embodiments of the present disclosure, an influence of an angular displacement of one or more magnetic rods on the magnetic field provided to the magnetic poles can be reduced or avoided. at least one magnetic rod is pressed against the corresponding magnetic pole with a force to provide physical contact. The force is such that the magnetic pole is not moved. Particularly, the radial distance to the center axis is not changed and the angles to the neighboring magnetic poles are not changed.

According to an aspect, a method of correcting aberration of a charged particle beam with an aberration corrector according to embodiments described herein is disclosed. The method includes guiding the charged particle beam through an opening of the aberration corrector, and correcting aberration of the charged particle beam.

Figure 7:
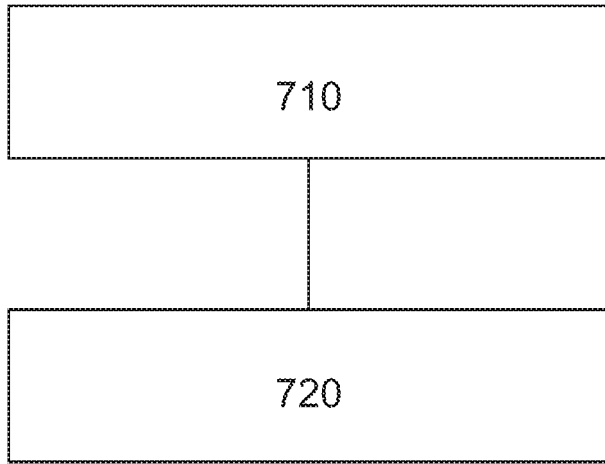
FIG. 7 is a flow diagram illustrating a method of correcting aberration of a charged particle beam with an aberration corrector according to embodiments described herein.

Referring now to FIG. 7, a flow diagram illustrating a method of correcting aberration of a charged particle beam with an aberration corrector according to embodiments described herein is shown. At step 710 a charged particle beam is guided through an opening of the aberration corrector. At step 720 aberration of the charged particle beam is corrected.

According to an embodiment, which can be combined with further embodiments described herein, the method of correcting aberration of a charged particle beam includes providing a magnetic field to the plurality of magnetic elements. According to a further embodiment, the method of correcting aberration of a charged particle beam includes deflecting charged particles of the charged particle beam towards a center axis, wherein the opening of the aberration corrector is concentric with the center axis. According to a further embodiment, the method of correcting aberration of a charged particle beam includes shaping the charged particle beam with multipole fields created by applying currents and or voltages to the aberration corrector.

In light of the above, a plurality of embodiments are provided in the present disclosure, some of which are as follows:

Embodiment 1. An aberration corrector, comprising: a first plurality of magnetic elements, each magnetic element comprising a magnetic pole and a corresponding magnetic rod for providing a magnetic field to the magnetic pole, the first plurality of magnetic elements comprising at least a first magnetic element, the first magnetic element comprising: a first magnetic pole; a first magnetic rod having a proximal end adjacent to the first magnetic pole and a distal end opposite the proximal end; the proximal end having a tip with a tip surface in a shape of a semi-spheroid; and a contact point of the tip surface contacts the first magnetic pole.

Embodiment 2. The aberration corrector according to embodiment 1, wherein the contact point of the tip surface contacts the first magnetic pole at a contact surface of the first magnetic pole, and the contact surface has a curvature smaller than a tip curvature of the tip surface, particularly the curvature is zero.

Embodiment 3. The aberration corrector according to any one of embodiments 1-2, wherein the first magnetic element comprises a first excitation coil disposed on the first magnetic rod.

Embodiment 4. The aberration corrector according to embodiment 3, wherein the first excitation coil is wound on a first carrier, the first carrier electrically insulating the first excitation coil from the first magnetic rod.

Embodiment 5. The aberration corrector according to any one of embodiments 1-4, wherein the first magnetic element comprises a first electrical connector connected to the first magnetic rod adjacent the distal end.

Embodiment 6. The aberration corrector according to embodiment 5, wherein the first magnetic element comprises a spring at the proximal end contacting the first magnetic pole to provide an electrical connection between the first magnetic rod and the first magnetic pole.

Embodiment 7. The aberration corrector according to any one of embodiments 1-6, further comprising a ring that magnetically connects the first plurality of magnetic elements with one another.

Embodiment 8. The aberration corrector according to embodiment 7, further comprising a foil positioned between the ring the first plurality of magnetic elements, wherein the foil electrically insulates the ring and the first plurality of magnetic elements.

Embodiment 9. The aberration corrector according to any one of embodiments 1-8, further comprising: a support configured to support at least the first magnetic rod.

Embodiment 10. The aberration corrector according to embodiment 9, wherein the support comprises a vacuum feedthrough for the first magnetic rod.

Embodiment 11. The aberration corrector according to any one of embodiments 1-10, further comprising: a pressing element configured to adjust a contact force between the first magnetic rod and the first magnetic pole.

Embodiment 12. The aberration corrector according to any one of embodiments 1-11, wherein each magnetic pole of the first plurality of magnetic elements is attached to an assembly ring.

Embodiment 13. The aberration corrector according to any one of embodiments 1-12, wherein the first plurality of magnetic elements comprises 8 magnetic elements forming an 8-pole or 12 magnetic elements forming a 12-pole.

Embodiment 14. The aberration corrector according to any one of embodiments 1-13, comprising a second stage comprising a second plurality of magnetic elements, each magnetic element of the second plurality of magnetic elements comprising a magnetic pole and a corresponding magnetic rod for providing a magnetic field to the magnetic pole, wherein a first stage comprises the first plurality of magnetic elements and the second stage is stacked over the first stage.

Embodiment 15. A charged particle beam apparatus, comprising: a sample stage; a charged particle source adapted to generate a charged particle beam; and a charged particle beam manipulation system including the aberration corrector according to any one of embodiments 1-14.

Embodiment 16. A method of aligning an aberration corrector, the method comprising: providing a plurality of magnetic poles, the magnetic poles having a predetermined alignment; and contacting the plurality of magnetic poles with a plurality of magnetic rods, wherein each of the plurality of magnetic rods is connected to a corresponding magnetic pole such that the predetermined alignment of the plurality of magnetic poles is substantially maintained.

Embodiment 17. The method according to embodiments 16, further comprising: pressing a tip surface of a first magnetic rod in a shape of a semi-spheroid onto a contact surface of a first magnetic pole.

Embodiment 18. The method according to any one of embodiments 16-17, further comprising: moving at least one magnetic rod of the plurality of magnetic rods during contacting of the corresponding magnetic pole with essentially no movement of the corresponding magnetic pole.

Embodiment 19. A method of correcting aberration of a charged particle beam with an aberration corrector according to any one of embodiments 1-14, comprising: guiding the charged particle beam through an opening of an aberration corrector; and correcting aberrations of the charged particle beam.

Embodiment 20. The method of correcting aberration of a charged particle beam according to embodiment 19. providing a magnetic field to the plurality of magnetic elements.

Embodiment 21. The method of correcting aberration of a charged particle beam according to any one of embodiments 19-20, comprising: biasing a plurality of electrodes of the aberration corrector to form an electrostatic multipole.

While the foregoing is directed to specific embodiments, other and further embodiments may be devised without departing from the basic scope thereof, and the scope thereof is determined by the claims that follow.

What is claimed is:

1. An aberration corrector, comprising:
   a first plurality of magnetic elements, each magnetic element comprising a magnetic pole and a corresponding magnetic rod for providing a magnetic field to the magnetic pole, the first plurality of magnetic elements comprising at least a first magnetic element, the first magnetic element comprising:
      a first magnetic pole;
      a first magnetic rod having a proximal end adjacent to the first magnetic pole and a distal end opposite the proximal end;
      the proximal end of the first magnetic rod having a tip with a tip surface in a shape of a curved semi-spheroid; and
      a contact point of the tip surface contacts the first magnetic pole.

2. The aberration corrector according to claim 1, wherein the contact point of the tip surface contacts the first magnetic pole at a contact surface of the first magnetic pole, and the contact surface has a curvature smaller than a tip curvature of the tip surface, particularly the curvature is zero.

3. The aberration corrector according to claim 1, wherein the first magnetic element comprises a first excitation coil disposed on the first magnetic rod.

4. The aberration corrector according to claim 3, wherein the first excitation coil is wound on a first carrier, the first carrier electrically insulating the first excitation coil from the first magnetic rod.

5. The aberration corrector according to claim 1, wherein the first magnetic element comprises a first electrical connector connected to the first magnetic rod adjacent the distal end.

6. The aberration corrector according to claim 5, wherein the first magnetic element comprises a spring at the proximal end contacting the first magnetic pole to provide an electrical connection between the first magnetic rod and the first magnetic pole.

7. The aberration corrector according to claim 1, further comprising a ring that magnetically connects the first plurality of magnetic elements with one another.

8. The aberration corrector according to claim 7, further comprising a foil positioned between the ring and the first plurality of magnetic elements, wherein the foil electrically insulates the ring and the first plurality of magnetic elements.

9. The aberration corrector according to claim 1, further comprising:
   a support configured to support at least the first magnetic rod.

10. The aberration corrector according to claim 9, wherein the support comprises a vacuum feedthrough for the first magnetic rod.

11. The aberration corrector according to claim 1, further comprising:
    a pressing element configured to adjust a contact force between the first magnetic rod and the first magnetic pole.

12. The aberration corrector according to claim 1, wherein each magnetic pole of the first plurality of magnetic elements is attached to an assembly ring.

13. The aberration corrector according to claim 1, wherein the first plurality of magnetic elements comprises 8 magnetic elements forming an 8-pole or 12 magnetic elements forming a 12-pole.

14. The aberration corrector according to claim 1, comprising a second stage comprising a second plurality of magnetic elements, each magnetic element of the second plurality of magnetic elements comprising a magnetic pole and a corresponding magnetic rod for providing a magnetic field to the magnetic pole, wherein a first stage comprises the first plurality of magnetic elements and the second stage is stacked over the first stage.

15. A method of correcting aberration of a charged particle beam with an aberration corrector according to claim 1, comprising:

guiding the charged particle beam through an opening of an aberration corrector; and correcting aberrations of the charged particle beam.

16. The method of correcting aberration of a charged particle beam according to claim 15, comprising:

providing a magnetic field to the plurality of magnetic elements.

17. The method of correcting aberration of a charged particle beam according to claim 15, comprising:

biasing a plurality of electrodes of the aberration corrector to form an electrostatic multipole.

18. A charged particle beam apparatus, comprising:

a sample stage;

a charged particle source adapted to generate a charged particle beam; and a charged particle beam manipulation system including an aberration corrector, the aberration corrector comprising:

a first plurality of magnetic elements, each magnetic element comprising a magnetic pole and a corresponding magnetic rod for providing a magnetic field to the magnetic pole, the first plurality of magnetic elements comprising at least a first magnetic element, the first magnetic element comprising:

a first magnetic pole;

a first magnetic rod having a proximal end adjacent to the first magnetic pole and a distal end opposite the proximal end;

the proximal end of the first magnetic rod having a tip with a tip surface in a shape of a curved semi-spheroid; and a contact point of the tip surface contacts the first magnetic pole.

19. A method of aligning an aberration corrector, the method comprising:

providing a plurality of magnetic poles, the magnetic poles having a predetermined alignment;

contacting the plurality of magnetic poles with a plurality of magnetic rods, wherein each of the plurality of magnetic rods is connected to a corresponding magnetic pole such that the predetermined alignment of the plurality of magnetic poles is substantially maintained; and pressing a tip surface of a first magnetic rod in a shape of a curved semi-spheroid onto a contact surface of a first magnetic pole.

20. The method according to claim 19, further comprising:

moving at least one magnetic rod of the plurality of magnetic rods during contacting of the corresponding magnetic pole with essentially no movement of the corresponding magnetic pole.

* * * * *